United States Patent

Nishimura

[11] Patent Number: 6,069,816
[45] Date of Patent: May 30, 2000

[54] HIGH-SPEED RESPONDING DATA STORING DEVICE FOR MAINTAINING STORED DATA WITHOUT POWER SUPPLY

[75] Inventor: Kiyoshi Nishimura, Kyoto, Japan

[73] Assignee: Rohm Co., Ltd., Kyoto, Japan

[21] Appl. No.: 09/198,841

[22] Filed: Nov. 24, 1998

[30] Foreign Application Priority Data

Nov. 27, 1997 [JP] Japan ................................. 9-326032

[51] Int. Cl.[7] ........................ G11C 11/22; G11C 11/00
[52] U.S. Cl. .................. 365/145; 365/154; 365/185.07; 257/295; 257/903
[58] Field of Search ................................. 365/145, 154, 365/156, 185.01, 185.07; 257/295, 379, 903

[56] References Cited

U.S. PATENT DOCUMENTS

| | | | |
|---|---|---|---|
| 4,809,225 | 2/1989 | Dimmler et al. | 365/145 |
| 5,146,299 | 9/1992 | Lampe et al. | 365/156 |
| 5,361,224 | 11/1994 | Takasu | 365/145 |
| 5,390,143 | 2/1995 | Manning | 365/145 |
| 5,535,154 | 7/1996 | Kiyono | 365/145 |
| 5,886,375 | 3/1999 | Sun | 257/296 |

*Primary Examiner*—Son Mai
*Attorney, Agent, or Firm*—Merchant & Gould P.C.

[57] ABSTRACT

It is an object of the present invention to provide a data storing device capable of responding in high speed without providing a power supply just for maintaining the stored data. A memory cell MC11 is made so as to replace only a memory transistor MT1 out of a pair of memory transistors MT1 and MT2 used for the prior art SRAM with a transistor with "MFMIS structure" having a ferroelectric layer 32. The ferroelectric layer 32 keep storing a polarization state in response to ON state stored in the memory transistor MT1 even when a power supply of the device is turned off. The memory transistor MT1 is turned into ON state in accordance with the polarization state stored in the ferroelectric layer 32 when the power supply is turned on again. In response to the change in state at the memory transistor MT1, the memory transistor MT2 is turned into OFF state. That is, the memory cell MC11 is defined as a ferroelectric memory. In addition, the reversal of the polarity in the ferroelectric layer 32 is carried out in high-speed.

15 Claims, 14 Drawing Sheets

HIGH-SPEED RESPONDING DATA STORING DEVICE FOR MAINTAINING STORED DATA WITHOUT POWER SUPPLY

CROSS-REFERENCE TO RELATED APPLICATION

The entire disclosure of Japanese Patent Application No. Hei 9-326032 filed on Nov. 27, 1997 including specification, claims, drawings and summary is incorporated herein by reference in its entirety.

BACKGROUND OF INVENTION

1. Field of the Invention

This invention relates to a data storing device, more specifically the data storing device having a plurality of memory cells including a first switch and a second switch, each of which shows different switching states.

2. Description of the Related Art

A static random access memory (hereinafter referred to as SRAM) using a metal oxide semiconductor field effect transistor (hereinafter referred to as MOSFET) is known as a data storing device. FIG. 14 is a circuit diagram illustrating an example of a memory cell composing an SRAM in the prior art.

A memory cell MC comprises a pair of transistors MT1 and MT2 for storing data (hereinafter referred to as memory transistors), and a pair of resistors R1 and R2. Also, the memory cell MC is connected to a pair of bit lines BL and BLB (both of the lines are referred to as bit lines pair BLP) through a pair of selector transistors ST1 and ST2 (both the transistors are referred to as selector transistors pair STP). Gate electrodes of the selector transistors pair STP are connected to a word line WL. A plurality of the memory cells MC are arranged within the SRAM in a matrix format.

In order to store a data into a memory cell in the SRAM, a voltage corresponding to the data to be stored therein is applied to the bit lines pair BLP. For example, both voltages representing "LOW" and "HIGH" are applied to the bit line BL and the bit line BLB respectively when data "0" is stored in the memory cell MC.

Then, the selector transistors pair STP is turned into ON state by applying a voltage representing "HIGH" to the word line WL. As a result, the memory transistor MT1 is in ON state while the memory transistor MT2 is in OFF state. Thus, the data "0" is stored in the memory cell MC. In order to store data "1" in the memory cell MC, voltages opposite to the previous such as the voltages representing "HIGH" and "LOW" may be applied to the bit line BL and the bit line BLB respectively.

Thereafter, the memory cell MC is turned into stand-by state by making the selector transistors pair STP into OFF state as a result of applying a voltage representing "LOW" to the word line WL. The data stored in the memory cell MC is remained as it is even when the memory cell MC is in the stand-by state as a result of a function so called "self-latching up" which is owned by the memory cell MC.

In order to read out the data stored in the memory cell MC, the selector transistors pair STP is turned into ON state by applying the voltage representing "HIGH" to the word line WL, and the voltages existing on the bit lines pair BLP are detected. In this way, the data stored in the memory cell MC can be detected.

However, the SRAM has the following problems to be resolved. In the SRAM described above, a voltage for maintaining the data stored therein need to be applied to the circuit all the time. A power supply just for maintaining the data is required even when neither storing nor reading the data are carried out. Therefore, unnecessary power is consumed under a condition that carries out no data storing and no data reading. Further, the data stored in the memory cell MC may be erased when the power source is out of order by an accident or other reasons.

Although, the use of an electrically erasable programmable read only memory (hereinafter referred to as EEPROM) would help to resolve the problem stated above, the EEPROM requiring a long time for storing the data is not suitable for a data storing device requiring high-speed responses. In addition, high voltages (for example voltages above 12 volts) are required for storing and erasing the data in the EEPROM. Therefore, either of a step-up transformer disposed on a chip or an additional power supply for high voltages beside the regular power supply is needed so that the chip having compactness as well as lower manufacturing cost can not be achieved.

SUMMARY OF THE INVENTION

It is an object of the present invention to overcome the above mentioned drawbacks on the data storing device such as the SRAM associated with prior arts, and to provide a data storing device capable of responding in a high speed without providing a power supply just for maintaining the stored data.

In accordance with characteristics of the present invention, there is provided a data storing device including a memory element having a first switch and a second switch each composed so as to show different switching states, either of a first storing state or a second storing state being stored in the memory element in response to data to be stored therein, the first storing state being defined as the first switch being ON state when the second switch being OFF state, and the second storing state being defined as the first switch being OFF state when the second switch being ON state, wherein a ferroelectric part is provided to at least one of the first switch and the second switch, and wherein the ferroelectric part stores a polarization state in response to the switching state of the switch.

While the novel features of the invention are set forth in a general fashion, both as to organization and content, the invention will be better understood and appreciated, along with other objects and features thereof from the following detailed description taken in conjunction with the drawings.

DETAILED DESCRIPTION OF THE PREFERRED EMBODIMENT

Figure 1:
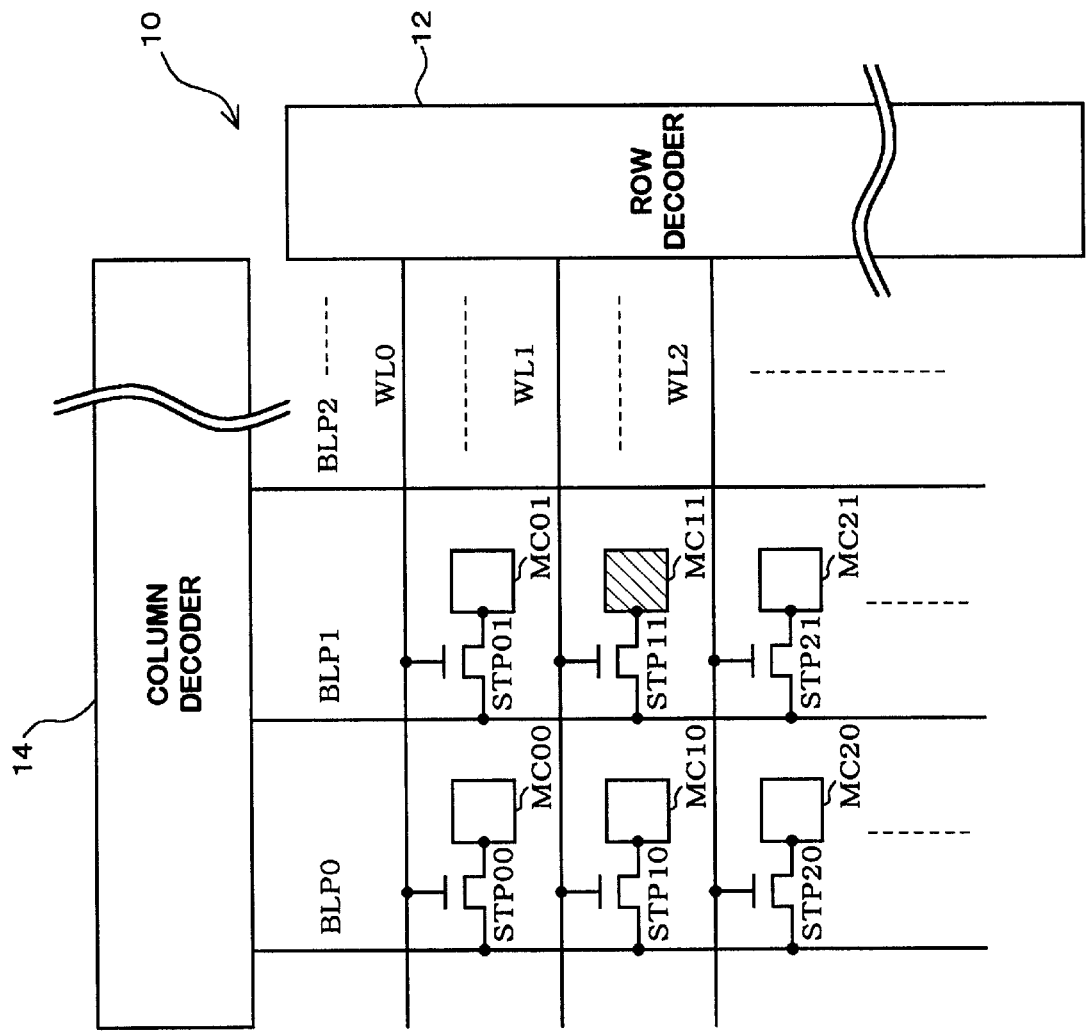
FIG. 1 is a diagram illustrating a typical structure of a memory device 10 as an example of a data storing device according to the present invention.

FIG. 1 is a diagram illustrating a typical structure of a memory device 10 as an example of data storing device according to the present invention. A plurality of the memory cells MC00, MC01, . . . are arranged within the memory device 10 in a matrix format. In other words, the memory cells MC00, MC01, . . . each forming a memory element are connected to cross points of word lines WL0, WL1, WL2, and bit lines pair BLP0, BLP1, . . . through selector transistors STP00, STP01, . . . .

All the word lines WL0, WL1, WL2, . . . and the bit lines pair BLP0, BLP1, . . . are respectively connected to row decoder 12 and column decoder 14.

In other words, one of the memory cells (for example, the memory cell MC11) is appointed by selecting one of the word lines (the word line WL1) and one of the bit lines pair (the bit lines pair BLP1) with the row decoder 12 and the column decoder 14 respectively.

One of the memory cells practically used is described with reference to the memory cell MC11 shown in FIG. 2. The memory cell MC11 comprises a memory transistor MT1 for storing data which forms a first switch, a memory transistor MT2 for storing data which forms a second switch, and a pair of resistors including a resistor R1 forming a first resistor and a resistor R2 forming a second resistor, and the parts described above are connected one another as shown in FIG. 2.

Further, the memory cell MC11 is connected to both bit lines BL1 and BLB1 (both of the lines consisting bit lines pair BLP1) through a pair of selector transistors ST11, ST21 (both of the transistors consisting a selector transistors pair STP11).

The memory transistor MT1 has a structure so called "MFMIS structure" (in which layers composed of a metal layer, a ferroelectric layer, another metal layer, an insulation layer and a silicon layer are formed sequentially in that order from the top).

Figure 14:
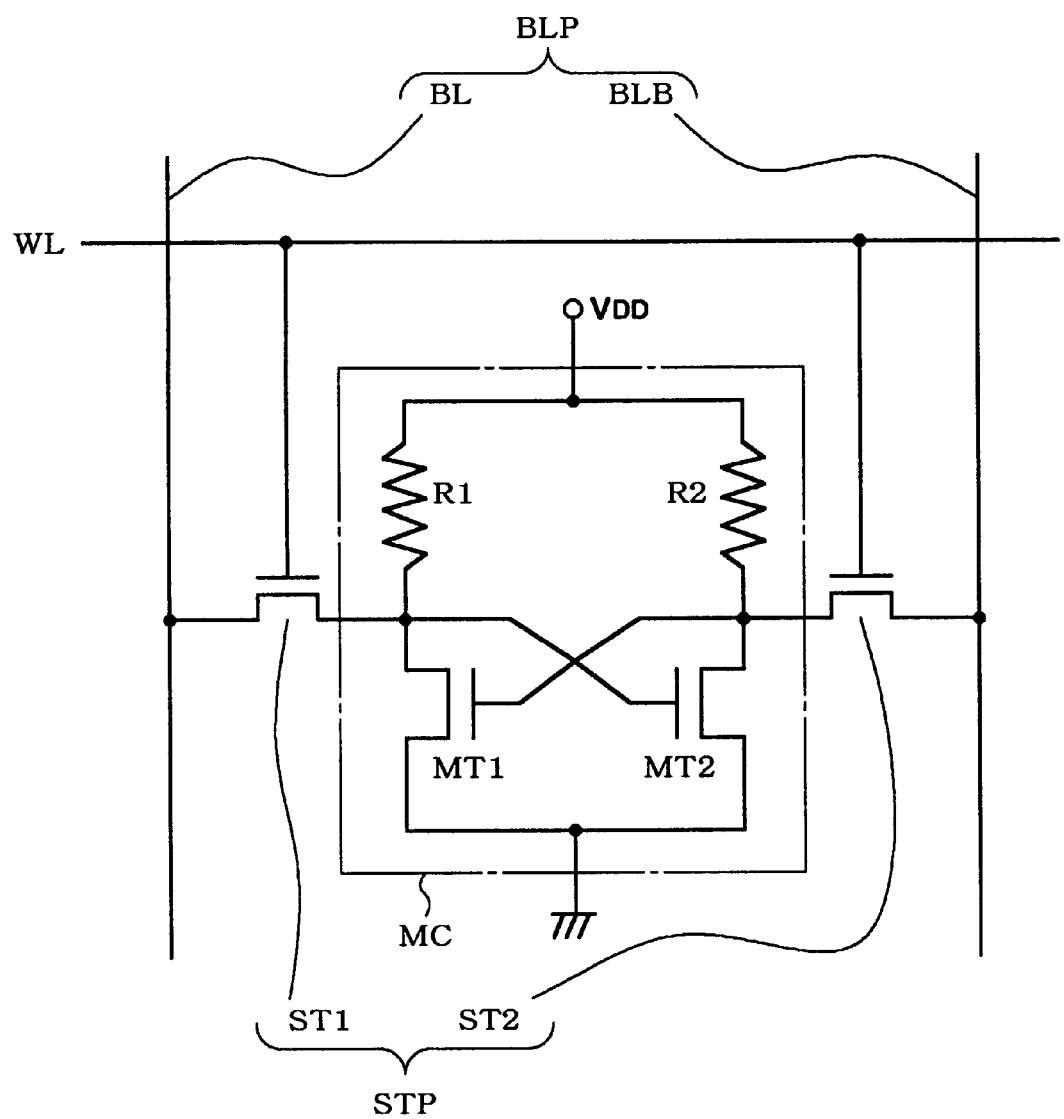
FIG. 14 is a circuit diagram illustrating an example of a memory cell composing an SRAM in the prior art.

In other words, the memory cell MC11 is formed by replacing only the memory transistor MT1 out of the pair of memory transistors MT1 and MT2 both composing the SRAM (the prior art SRAM shown in FIG. 14) with a transistor having the "MFMIS structure".

Figure 3A:
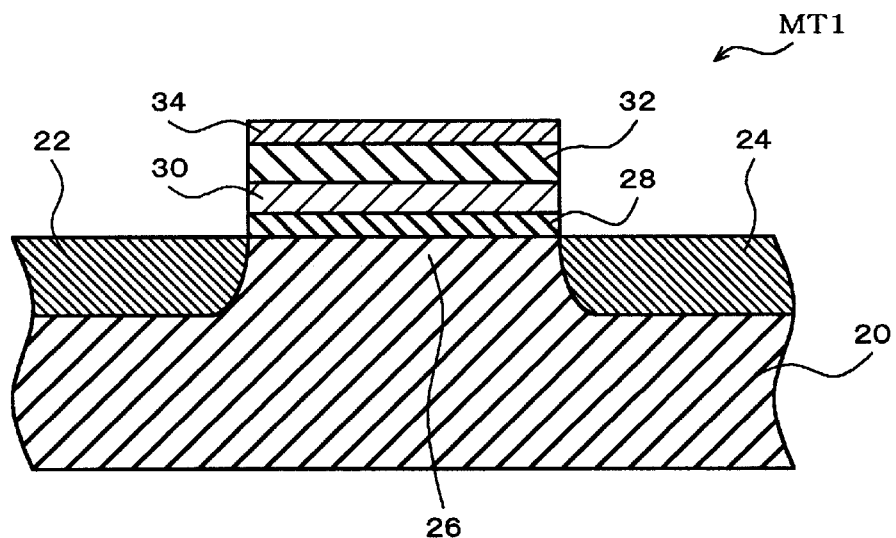
FIG. 3A is a sectional view illustrating the structure of a memory transistor MT1.

FIG. 3A illustrates the structure of the memory transistor MT1. Both a source region 22 and a drain region 24 made of an n-type (a first conductive type) semiconductor are formed in a silicon substrate 20 with p-type forming a semiconductor substrate. An insulation layer 28 made of silicon oxide ($SiO_2$) is disposed on a channel region 26 made of a p-type (a second conductive type) semiconductor. A lower conductive layer (a first conductive layer) 30 formed sequentially with polysilicon (Poliy-Si), iridium oxide ($IrO_2$), and iridium (Ir) in that order is formed on the insulation layer 28.

A ferroelectric layer (ferroelectric part) 32 made of PZT and the like are formed on the lower conductive layer 30. Polarization state corresponding (in response) to the switching state of the memory transistor MT1 is stored in the ferroelectric layer 32. The polarization state will be described later.

An upper conductive layer (a second conductive layer) 34 made of an iridium oxide ($IrO_2$) layer, and an iridium (Ir) layer formed in that order is located on the ferroelectric layer 32.

The insulation layer 28 can also be formed with silicon nitride (SiN) or the like instead of the layers stated above. Further, the lower conductive layer 30 and the upper conductive layer 34 can be formed with oxide conductors such as ruthenium oxide (RuOx), indium tin oxide (ITO) or metals such as platinum (Pt), lead (Pb), gold (Au), silver (Ag), aluminum (Al), nickel (Ni) and the like.

Figure 3B:
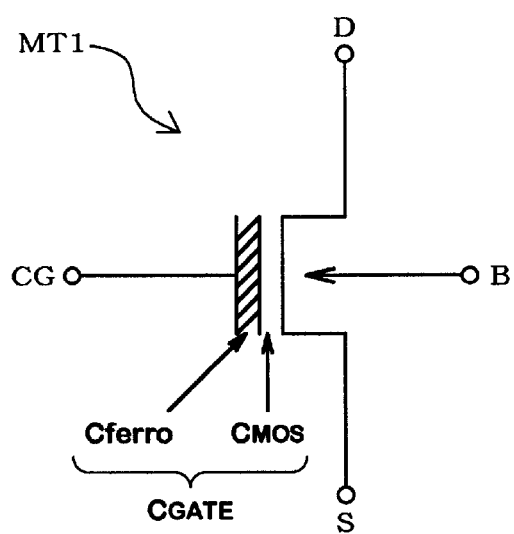
FIG. 3B is a view illustrating a schematic symbol of the memory transistor MT1 shown in FIG. 3A.

FIG. 3B is a view illustrating a schematic symbol of the memory transistor MT1 shown in FIG. 3A. A control gate electrode CG is connected to the upper conductive layer 34. The lower conductive layer 30 is made under a floating state because no electrodes are connected thereto. A source electrode S and a drain electrode D are connected to the source region 22 and the drain region 24 respectively.

Figure 4A:
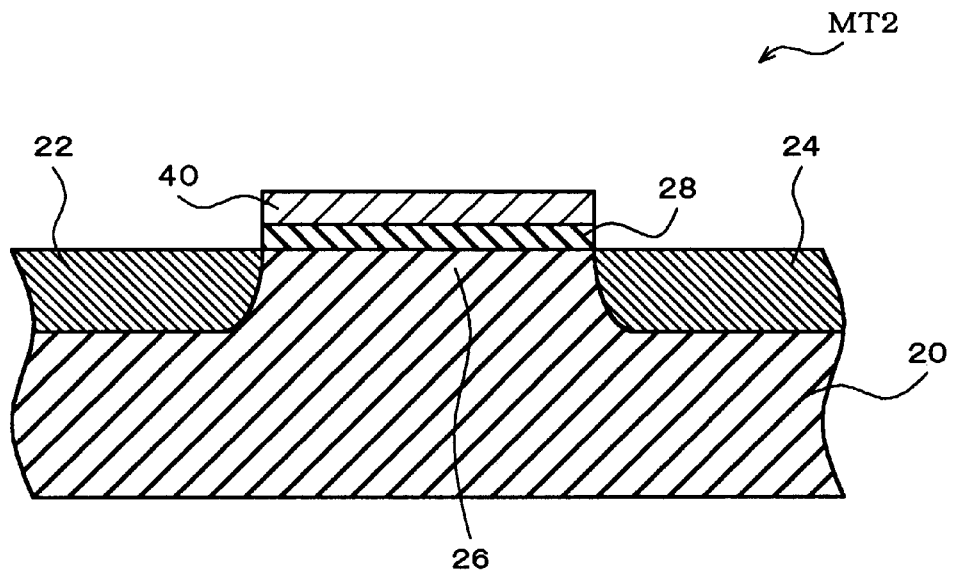
FIG. 4A is a sectional view illustrating the structure of a memory transistor MT2.

FIG. 4A is a sectional view illustrating the structure of the memory transistor MT2. The memory transistor MT2 is a MOSFET with n-channel. Both a source region 22 and a drain region 24 made of an n-type semiconductor are formed in a silicon substrate 20 with p-type forming the semiconductor substrate. An insulation layer 28 made of silicon oxidation ($SiO_2$) is disposed on the channel region 26 made of a p-type semiconductor. A conductive layer (a first conductive layer) 40 made of poly-silicon is formed on the insulation layer 28.

Figure 4B:
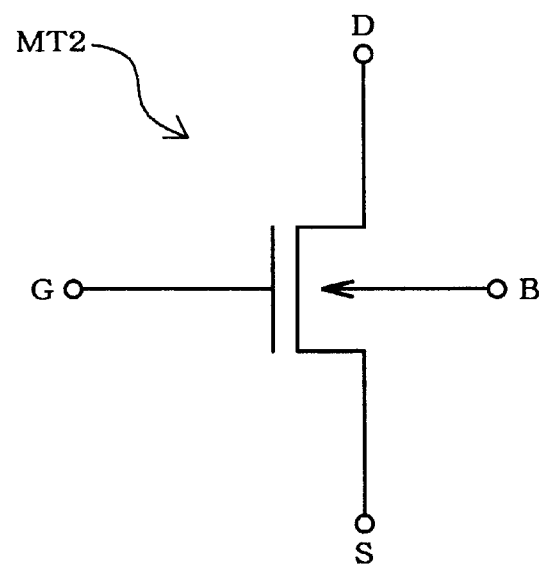
FIG. 4B is a view illustrating a schematic symbol of the memory transistor MT2 shown in FIG. 4A.

FIG. 4B is a view illustrating a schematic symbol of the memory transistor MT2 shown in FIG. 4A. A gate electrode G is connected to the conductive layer 40. A source electrode S and a drain electrode D are connected to the source region 22 and the drain region 24 respectively.

Both the selector transistors ST11 and ST21 are MOSFETs with n-channel having a similar structure to that of the memory transistor MT2.

Although, the structure of the memory cell MC11 is described as an example, the structure of other memory cells MC00, MC01, . . . is similar to that of the memory cell MC11.

Figure 5:
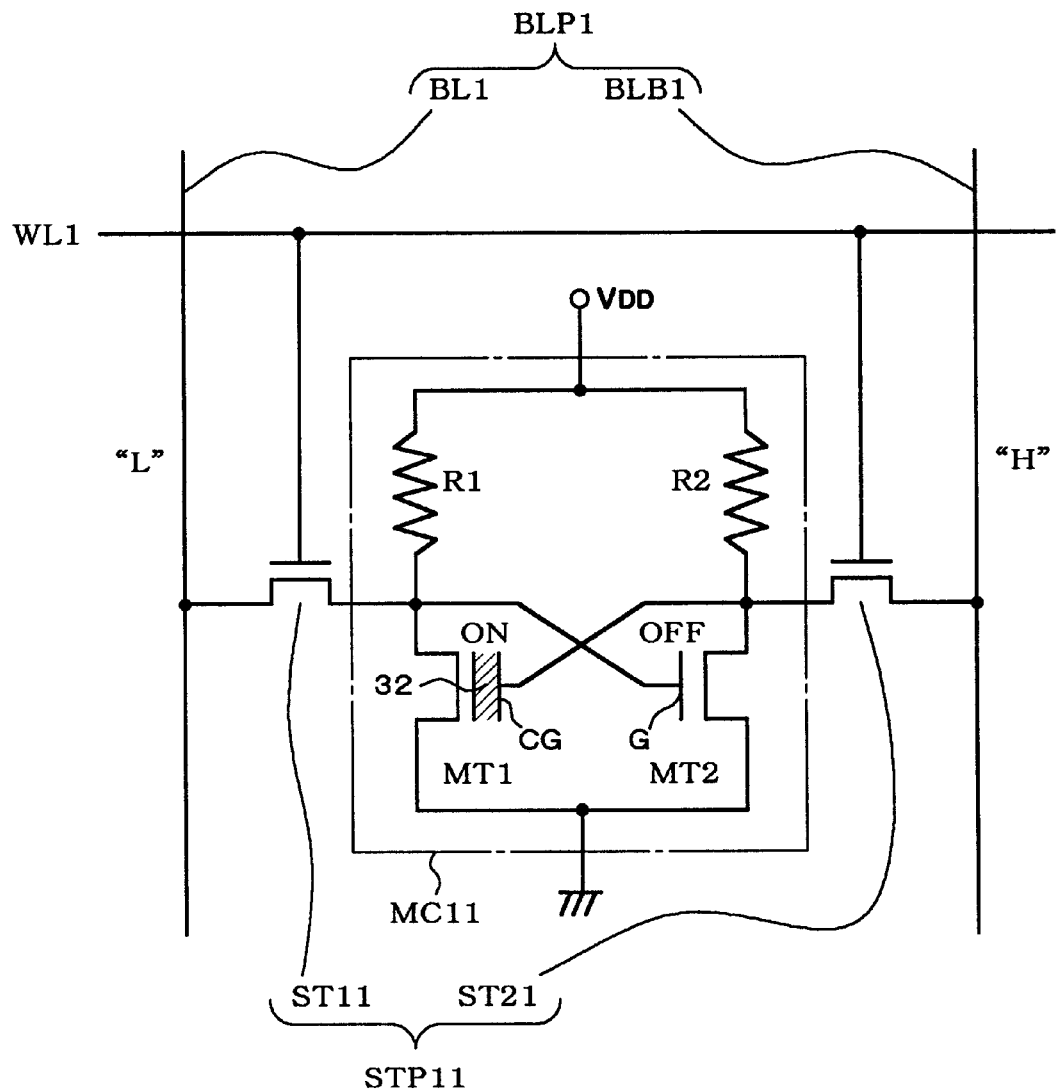
FIG. 5 is another diagram of the memory cell MC11 illustrating the voltages applied for storing data "0" therein.

Next, operation of storing a data into the memory device 10 shown in FIG. 1 is described hereunder. FIG. 5 is another diagram of the memory cell MC11 illustrating the voltages applied for storing data "0" therein. The operation of storing data "0" into the memory cell MC11 will be described with reference to FIG. 5.

A voltage corresponding to the data to be stored in the memory cell is applied to the bit lines pair BLP1 while selecting the bit lines pair BLP1 with the column decoder 14 shown in FIG. 1. In other words, voltages representing "LOW (a ground voltage)" and "HIGH (a power supply voltage $V_{DD}$)" are applied to the bit line BL1 and to the bit line BLB1 respectively both composing the bit lines pair BLP1(see FIG. 5).

Thereafter, a selector transistors pair STP11 composed of the selector transistors ST11 and ST21 is turned into ON state by applying a voltage representing "HIGH" to the word line WL1 while selecting the word line WL1 with the row decoder 12. In this way, a voltage representing "LOW" is applied to the gate electrode G of the memory transistor MT2 disposed in the memory cell MC11 as shown in FIG. 5. The threshold voltage $V_{th}$ of the memory transistor MT2 is set so as the memory transistor MT2 to be in OFF state when a voltage applied to the gate electrode G is in "LOW".

On the contrary, a voltage representing "HIGH" is applied to the control gate electrode CG of the memory transistor MT1. As described later, the threshold voltage $V_{th}$ of the memory transistor MT1 is set so as the memory transistor MT1 to be in ON state when a voltage applied to the control gate electrode CG is in "HIGH".

Then, the memory cell MC11 is turned into the stand-by state by turning the selector transistors pair STP11 into OFF state as a result of applying a voltage representing "LOW" to the word line WL1. Both the OFF state and ON state stored respectively in the memory transistors MT2 and MT1 are remained as they are even when the memory cell MC11 is in the stand-by state as a result of the "self-latching up" of the memory cell MC11.

Therefore, the data "0" stored in the memory cell MC11 is remained as it is. The condition of the memory cell MC11 shown in FIG. 5 is defined as a first data storing condition corresponding to the data to be stored such as "0".

Variation of polarization states observed in the ferroelectric layer 32 of the memory transistor MT1 during the operation from the data storing of "0" to the stand-by state will be described. As shown in FIG. 3A and FIG. 3B, the memory transistor MT1 may be assumed as two capacitors such as a ferroelectric capacitor $C_{ferro}$ formed between the upper conductive layer 34 and the lower conductive layer 30, and a MOS capacitor $C_{MOS}$ formed between the lower conductive layer 30 and the channel region 26 both of which are connected to each other in series. The capacitor incorporates both the ferroelectric capacitor $C_{ferro}$ and the MOS capacitor $C_{MOS}$ is referred to as a capacitor $C_{GATE}$.

Figure 6:
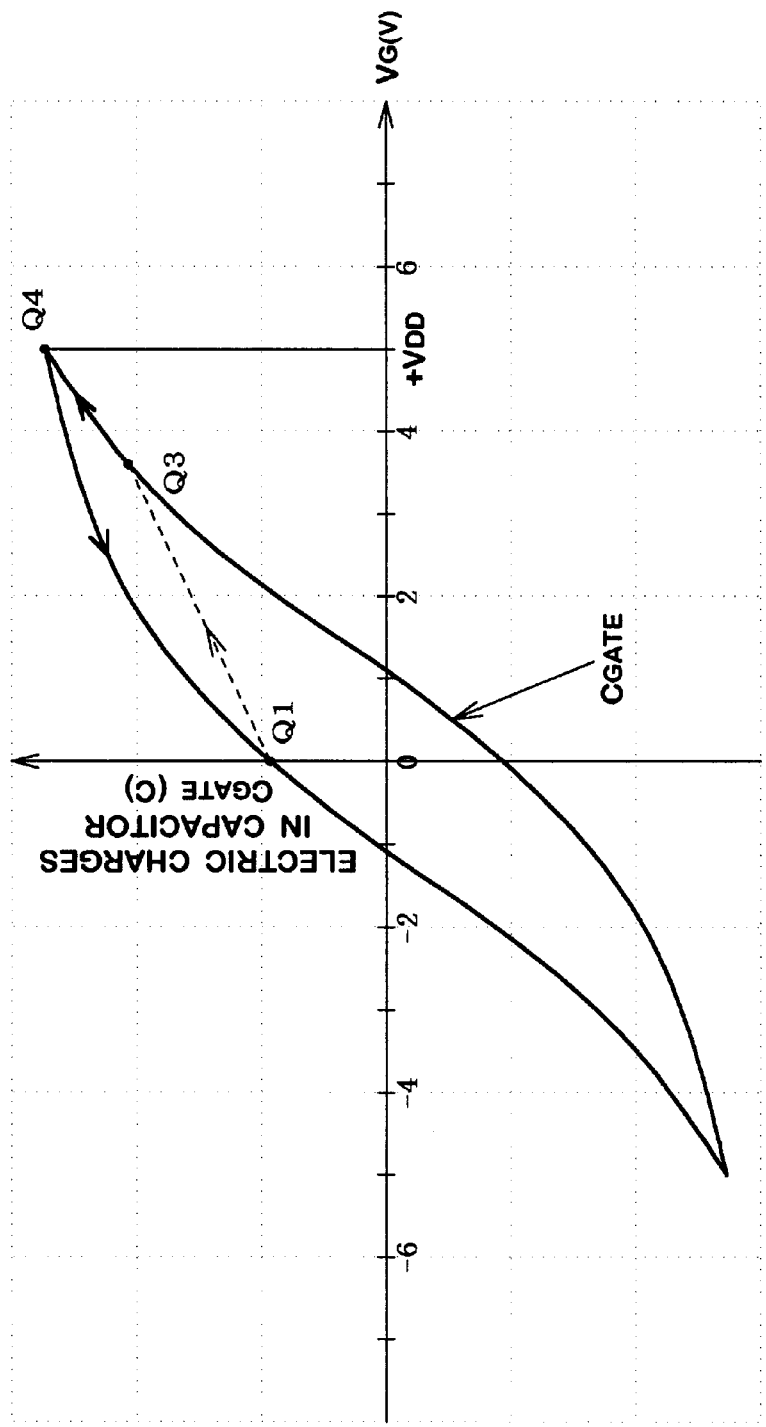
FIG. 6 is a graph showing an example of voltage/charge characteristics of a capacitor $C_{GATE}$ when the data "0" is stored in the memory cell MC11.
Figure 7:
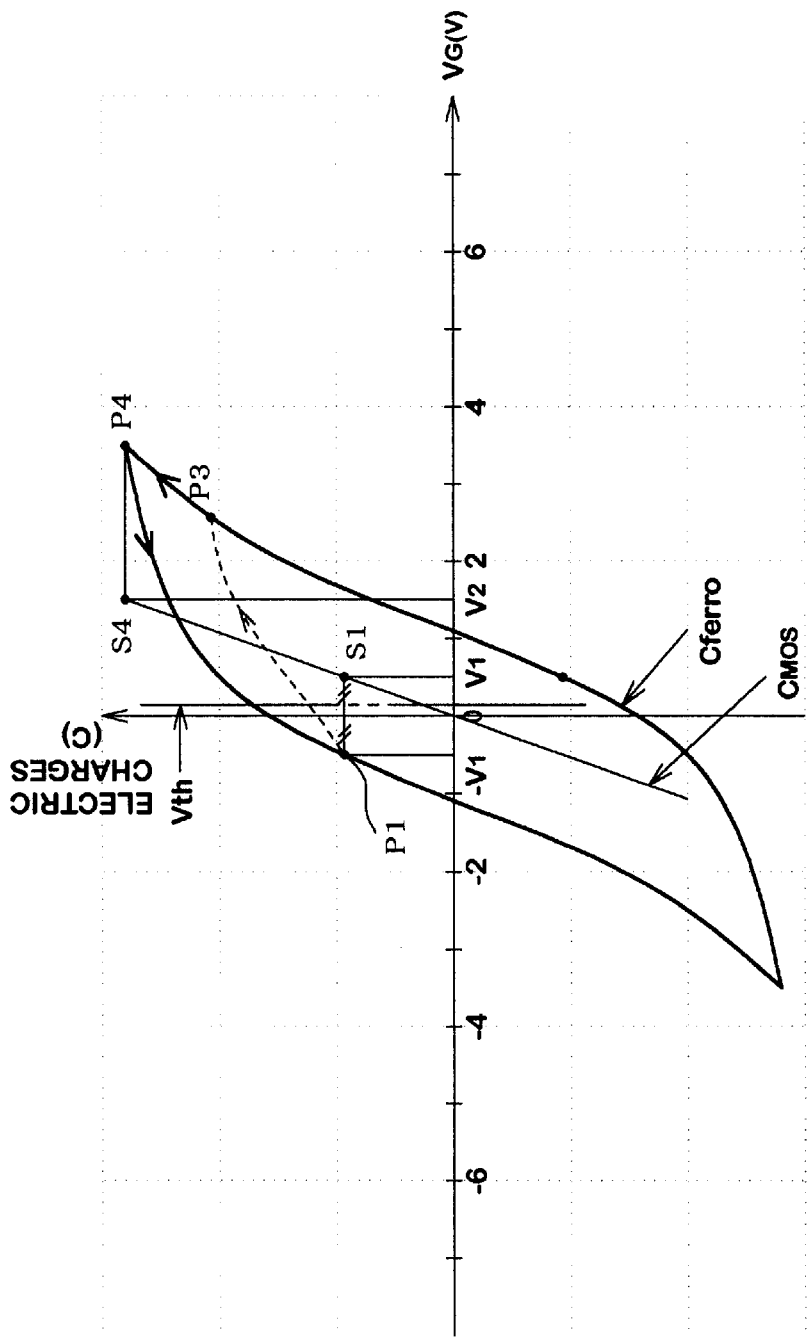
FIG. 7 is a graph showing voltage/charge characteristics of a capacitor $C_{ferro}$ and a capacitor $C_{MOS}$ when the data "0" is stored in the memory cell MC11.

FIG. 6 is a graph showing an example of voltage/charge characteristics of a capacitor $C_{GATE}$ when the data "0" is stored in the memory cell MC11. FIG. 7 is a graph showing voltage/charge characteristics of both the capacitor $C_{ferro}$ and the MOS capacitor $C_{MOS}$ when the data "0" is stored in the memory cell MC11.

Electric potential of the channel region 26 (see FIG. 3A) is substantially equal to the ground voltage because the memory transistor MT1 is turned into ON state (see FIG. 5) as described above. Further, the voltage representing "HIGH (the power supply voltage $V_{DD}$)" is applied to the control gate electrode CG of the memory transistor MT1. In this way, the power supply voltage $V_{DD}$ having a polarity of positive which is determined based on the potential of the channel region 26 is applied to the capacitor $C_{GATE}$.

As a result, the condition of the voltage and the electric charges existing in the capacitor $C_{GATE}$ is moved to a point Q4 as shown in FIG. 6. At that time, the condition of the voltage and the electric charges existing in the ferroelectric capacitor $C_{ferro}$ is changed to a point P4 as shown in FIG. 7. Similarly, the condition of the voltage and the electric charges existing in the MOS capacitor $C_{MOS}$ is changed to a point S4. It is clearly recognized that a voltage $V_2$ generated at the MOS capacitor $C_{MOS}$ is greater than the threshold voltage $V_{th}$ of the memory transistor MT1.

Next, operation of the memory device 10 is described hereunder when the power supply of which (not shown) is turned off once and is turned on later. The voltage and the electric charge illustrated in a point Q1 shown in FIG. 6 are existed in the capacitor $C_{GATE}$ with the time elapsed when a power supply (not shown) of the memory cell device 10 is turned off while remaining the data "0" in the memory cell MC11. At that time, the voltages and the electric charges existed in both the capacitor $C_{ferro}$ and the MOS capacitor $C_{MOS}$ are shown as a point P1 and a point S1 respectively in FIG. 7.

The electric charges at both the point P1 and the point S1 shown in FIG. 7 are equal to that of a point Q1 shown in FIG. 6 because the capacitor $C_{ferro}$ and the MOS capacitor $C_{MOS}$ are connected with each other in series. A sum total of voltages at both the point P1 and the point S1 in FIG. 7 are zero volt. Therefore, the voltage at the point P1 is detected as a voltage $-V_1$ which has the same absolute value and opposite in the sign to the voltage at the point S1 when the voltage at the point S1 is defined as a voltage $V_1$.

The voltage at the MOS capacitor $C_{MOS}$ is detected as the voltage $V_1$ at the time when the power supply of the memory device 10 is turned on again. The value of the voltage $V_1$ is greater than that of the threshold voltage $V_{th}$ of the memory transistor MT1. Therefore, the memory transistor MT1 will be in ON state shortly.

In other words, the condition of the voltages and the electric charges existing in the capacitor $C_{GATE}$ is returned to the point Q4 from the point Q1 through a point Q3 as shown in FIG. 6. At that time, the condition of the voltages and the electric charges existing in the ferroelectric capacitor $C_{ferro}$ is returned to a point P4 from the point P1 through a point P3 as shown in FIG. 7. Similarly, condition of the voltages and the electric charges existing in the MOS capacitor $C_{MOS}$ is returned to a point S4 from the point S1.

The other memory transistor MT2 will be in OFF state accompanied by the change in the conditions. It is understood that the memory cell MC11 returns to the condition prior to turn off the power supply of the memory device 10, that is the first data storing condition corresponding to the data "0".

Figure 8:
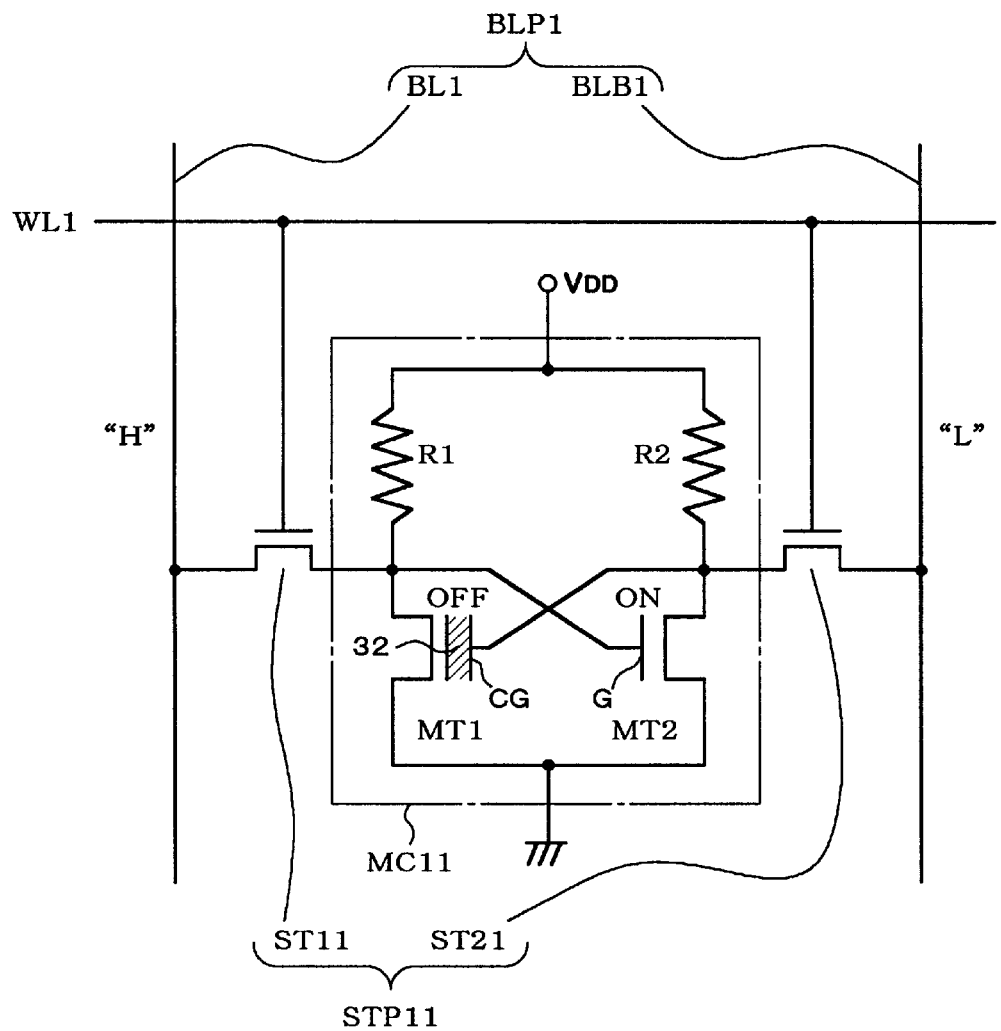
FIG. 8 is another diagram of the memory cell MC11 illustrating the voltages applied for storing data "1" therein.

Next, operation for storing data "1" into the memory cell MC11 is described hereunder. FIG. 8 is another diagram of the memory cell MC11 illustrating the voltages applied for storing data "1" therein.

The bit lines pair BLP1 is selected with the column decoder 14 shown in FIG. 1 similar to the case of storing data "0" therein. At that time, a voltage corresponding to the data "1" is applied to the bit lines pair BLP1. In other words, voltages representing "HIGH (the power supply voltage $V_{DD}$)" and "LOW (the ground voltage)" are applied to the bit line BL1 and to the bit line BLB1 respectively both composing the bit lines pair BLP1 (see FIG. 8).

Thereafter, the selector transistors pair STP11 is turned into ON state by applying the voltage representing "HIGH" to the word line WL1 while selecting the word line WL1 with the row decoder 12 similar to the case of storing data "0". In this way, the voltage representing "HIGH" is applied to the gate electrode G of the memory transistor MT2 disposed in the memory cell MC11 as shown in FIG. 8. The threshold voltage $V_{th}$ of the memory transistor MT2 is set so as the memory transistor MT2 to be in ON state when the voltage applied to the gate electrode G is in "HIGH".

On the contrary, the voltage representing "LOW" is applied to the control gate electrode CG of the memory transistor MT1 disposed in the memory cell MC11. The threshold voltage $V_{th}$ of the memory transistor MT1 is set so as the memory transistor MT1 to be in OFF state when the voltage applied to the control gate electrode CG is in "LOW".

Then, the memory cell MC11 is turned into the stand-by state by turning the selector transistors pair STP11 into OFF state as a result of applying the voltage representing "LOW" to the word line WL1 similar to the case of storing data "0". Both the ON state stored in the memory transistor MT2 and the OFF state stored in the memory transistor MT1 are remained as they are even when the memory cell MC11 is in the stand-by state as a result of the "self-latching up" thereof. Therefore, the data "1" stored in the memory cell MC11 is remained as it is. The condition of the memory cell MC11 shown in FIG. 8 is defined as a second data storing condition corresponding to the data to be stored such as "1".

Variation of polarization state observed in the ferroelectric layer 32 of the memory transistor MT1 during the operation from the data storing of "1" to the stand-by state will be described.

Figure 9:
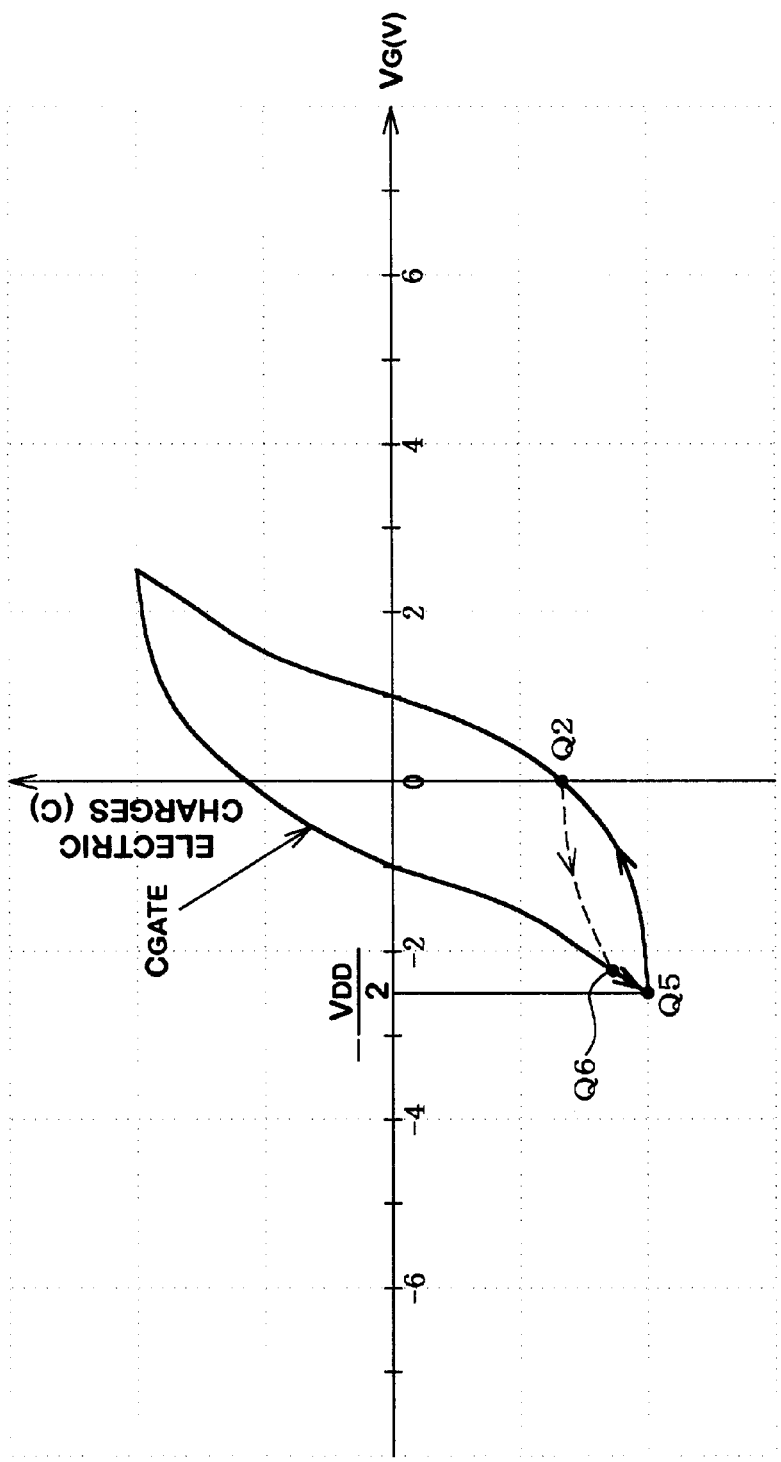
FIG. 9 is a graph showing an example of voltage/charge characteristics of the capacitor $C_{GATE}$ when the data "1" is stored in the memory cell MC11.
Figure 10:
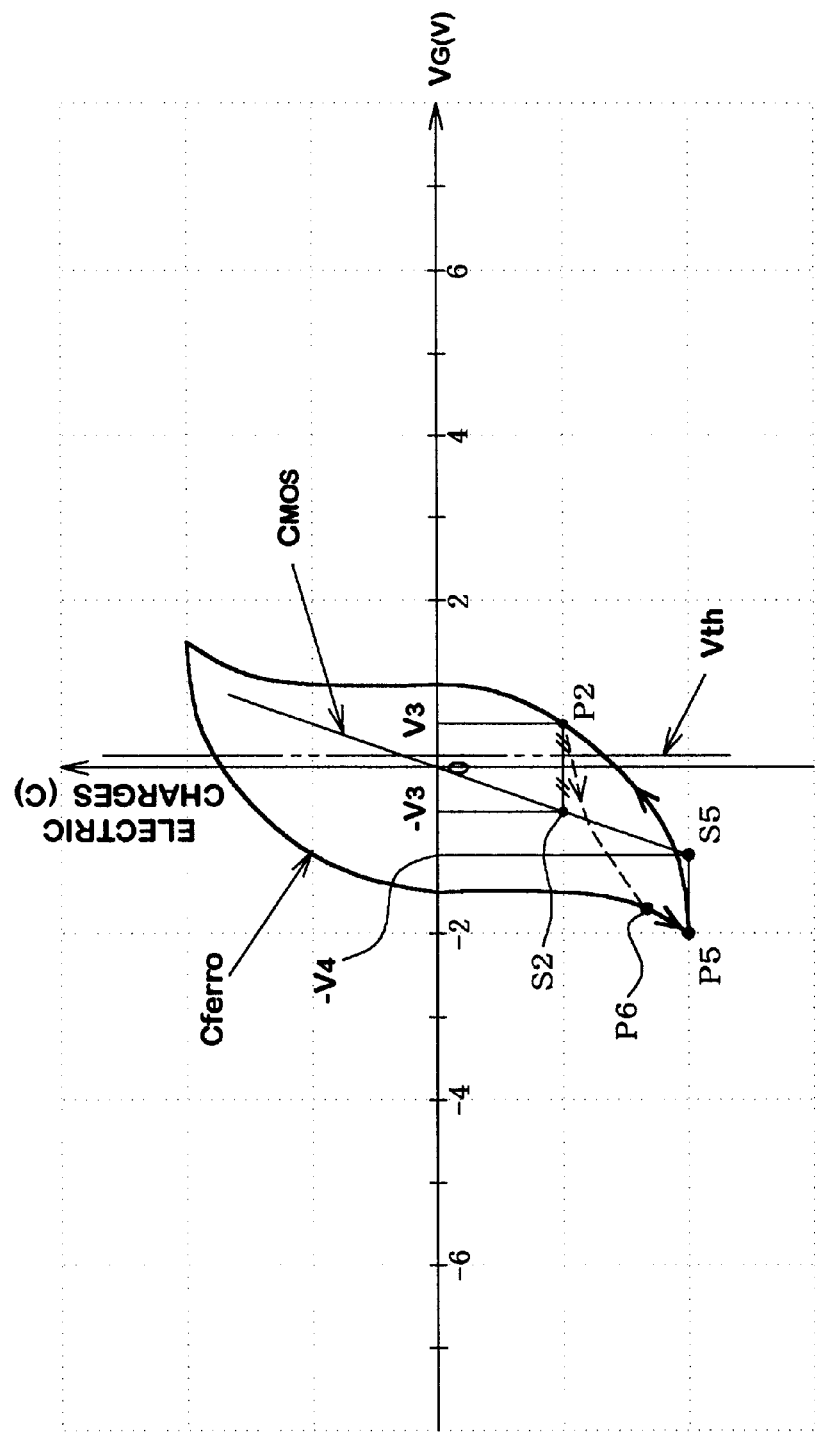
FIG. 10 is a graph showing voltage/charge characteristics of the capacitor $C_{ferro}$ and the capacitor $C_{MOS}$ when the data "1" is stored in the memory cell MC11.

FIG. 9 is a graph showing one example of voltage/charge characteristics of the capacitor $C_{GATE}$ when the data "1" is stored in the memory cell MC11. Voltage/charge characteristics of the capacitor $C_{ferro}$ and the capacitor $C_{MOS}$ in the case of storing data "1" are shown in FIG. 10.

Electric potential of the channel region 26 (see FIG. 3A) is substantially half of the power supply voltage $V_{DD}$ because the memory transistor MT1 shown in FIG. 8 is turned into OFF state as described above. Further, the voltage representing "LOW (the ground voltage)" is applied to the control gate electrode CG of the memory transistor MT1. In this way, a voltage having half a value of $V_{DD}$ with a polarity of negative which is determined based on the potential of the channel region 26 is applied to the capacitor $C_{GATE}$.

As a result, the condition of the voltage and the electric charges existing in the capacitor $C_{GATE}$ is moved to a point Q5 as shown in FIG. 9. At that time, the condition of the voltage and the electric charges existing in the ferroelectric capacitor $C_{ferro}$ is changed to a point P5 as shown in FIG. 10. Similarly, the condition of the voltage and the electric charges existing in the MOS capacitor $C_{MOS}$ is changed to a point S5. It is clearly recognized that a voltage $-V_4$ generated at the MOS capacitor $C_{MOS}$ is less than the threshold voltage $V_{th}$ of the memory transistor MT1.

Next, operation of the memory device 10 is described hereunder when the power supply of which is turned off once and is turned on later. The voltage and the electric charge illustrated in a point Q2 shown in FIG. 9 are existed in the capacitor $C_{GATE}$ with the time elapsed when the power supply of the memory cell device 10 is turned off while remaining the data "1" in the memory cell MC11. At that time, the voltages and the electric charges existed in both the capacitor $C_{ferro}$ and the MOS capacitor $C_{MOS}$ are shown as a point P2 and a point S2 respectively in FIG. 10.

The electric charges at both the point P2 and the point S2 shown in FIG. 10 are equal to that of the point Q2 shown in FIG. 9 because the capacitor $C_{ferro}$ and the MOS capacitor $C_{MOS}$ are connected with each other in series. A sum total of voltages at both the point P2 and the point S2 in FIG. 10 are zero volt. Therefore, the voltage at the point P2 is detected as a voltage $V_3$ which has the same absolute value and opposite in the sign to the voltage at the point S2 when the voltage at the point S2 is defined as a voltage $-V_3$.

The voltage at the MOS capacitor $C_{MOS}$ is detected as the voltage $-V_3$ at the time when the power supply of the memory device 10 is turned on again. The value of the voltage $-V_3$ is less than that of the threshold voltage $V_{th}$ of the memory transistor MT1. Therefore, the memory transistor MT1 will be OFF state shortly.

In other words, the condition of the voltages and the electric charges existing in the capacitor $C_{GATE}$ is returned to a point Q5 from a point Q2 through a point Q6 as shown in FIG. 9. At that time, the condition of the voltages and the electric charges existing in the ferroelectric capacitor $C_{ferro}$ is returned to the point P5 from the point P2 through a point P6 as shown in FIG. 10. Similarly, the condition of the voltages and the electric charges existing in the MOS capacitor $C_{MOS}$ is returned to the point S5 from the point S2.

The other memory transistor MT2 will be in ON state accompanied by the change in the conditions. It is understood that the memory cell MC11 returns to the condition prior to turn off the power supply of the memory device 10, that is the second data storing condition corresponding to the data "1".

As described above, the memory device 10 keep storing the data regardless of its substances even when its power supply is turned off. Namely, the inventor considers the memory device 10 as a nonvolatile memory device.

Next, operation for reading out the data stored in the memory cell MC11 is described hereunder.

The selector transistors pair STP11 is turned into ON state by applying the voltage representing "HIGH" to the word line WL1 while selecting the word line WL1 with the row decoder 12 shown in FIG. 1. In this way, the voltage corresponding to the data to be stored is existed on the bit lines pair BLP1.

For example, the voltages representing "LOW" and "HIGH" are detected on the bit line BL1 and the bit line BLB1 respectively when data "0" is stored in the memory cell MC11 as described above using FIG. 5. On the contrary, voltages representing "HIGH" and "LOW" are detected on the bit line BL1 and the bit line BLB1 respectively when data "1" is stored in the memory cell MC11 as described above and diagramed in FIG. 8.

The data stored in the memory cell MC11 may be read out by detecting the voltage generated on the bit lines pair BLP1 while selecting the bit lines pair BLP1 with the column decoder 14 shown in FIG. 1.

Figure 11:
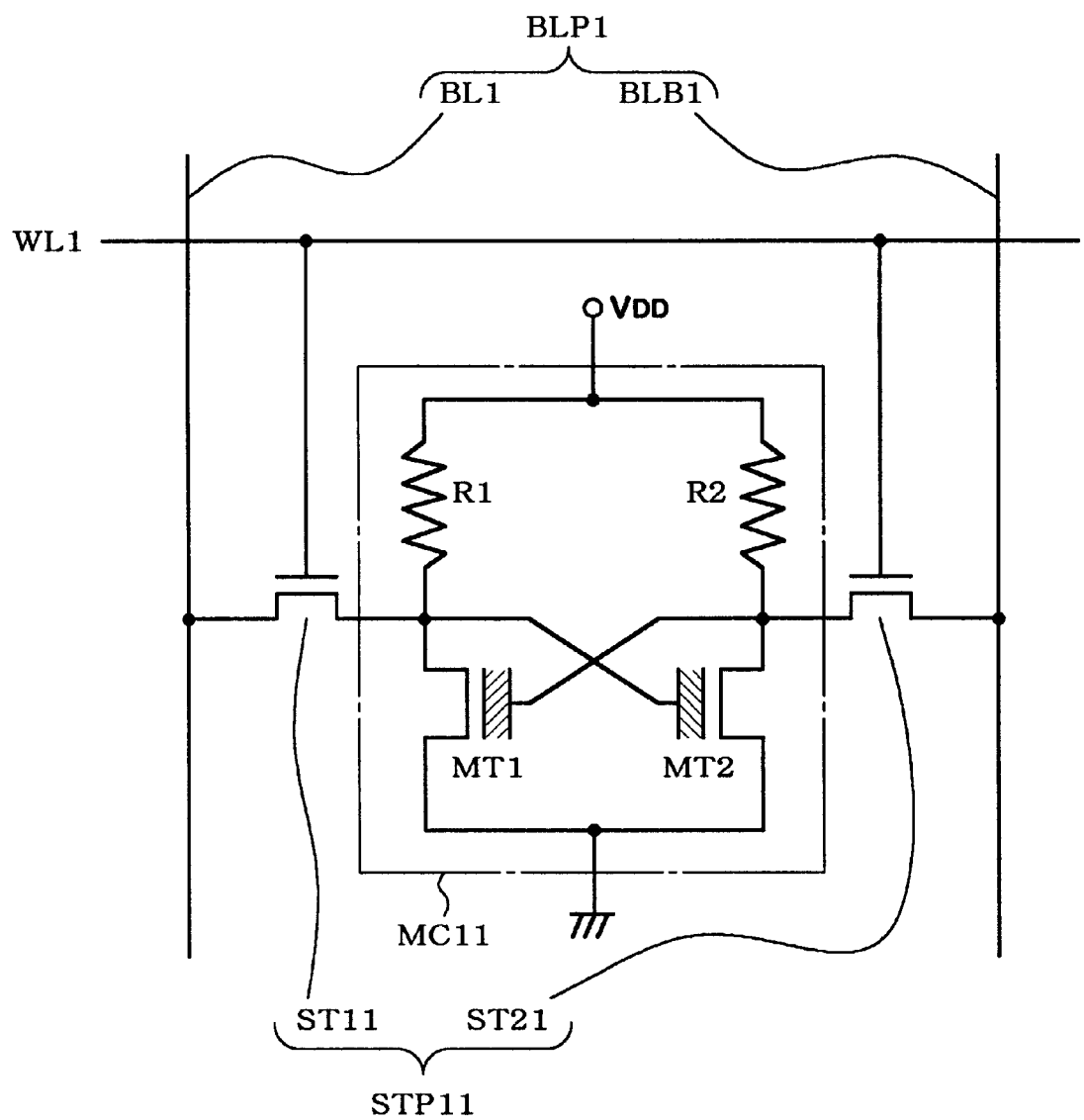
FIG. 11 is another circuit diagram of the memory cell MC11 in practical use in another embodiment according to the present invention.

Although, the memory cell MC11 according to the embodiments above is formed by replacing only the memory transistor MT1 out of the pair of memory transistors MT1 and MT2 both composing the prior art SRAM with the transistor having the "MFMIS structure", the memory cell MC11 can be formed by replacing both the memory transistors MT1 and MT2 with the transistors having the "MFMIS structure" as shown in FIG. 11.

By constructing the memory cell MC11 as shown in FIG. 11, the cell MC11 can return to the condition prior to turn off its power supply even when the power supply is turned off once and is turned on later. In other words, a data storing device having higher reliability can be realized.

Although, the transistors having the "MFMIS structure" are used for describing the switch(es) including ferroelectric part(s) in the embodiments above, any other type of transistors can be used instead of the MFMIS structured transistors. For example, the memory transistor MT1 shown in FIG. 12 may be used as the switch including a ferroelectric part.

Figure 12:
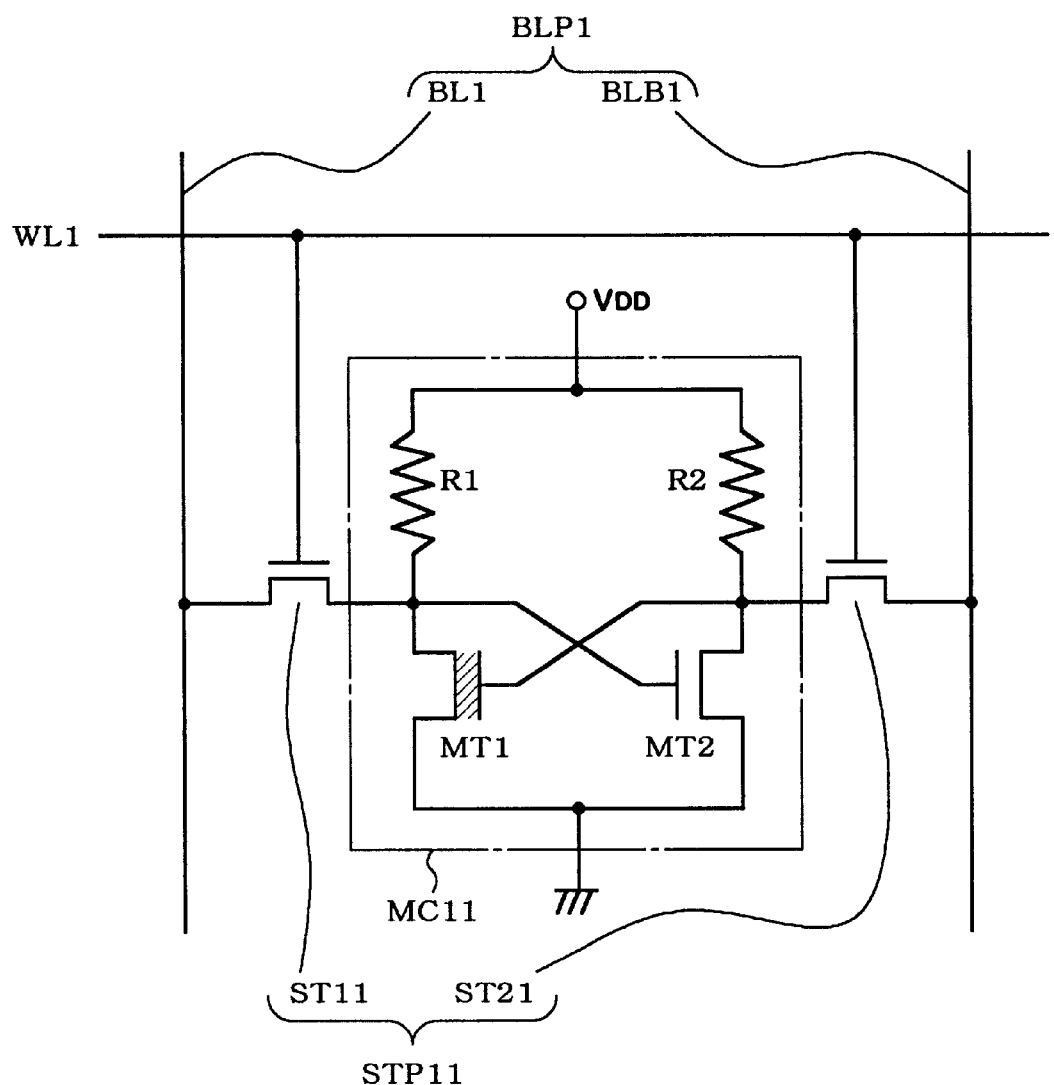
FIG. 12 is still another circuit diagram of the memory cell MC11 in practical use in another embodiment according to the present invention.

The memory transistor MT1 shown in FIG. 12 is a transistor which replaces the insulation layer 28 made of silicon oxidation substance formed on an ordinary MOSFET shown in FIG. 4A with a layer made of one of a ferroelectric materials such as PZT. Therefore, a nonvolatile memory device can easily be fabricated by changing a part of the material(s) used for the prior SRAM or other prior art data storing devices.

Figure 13:
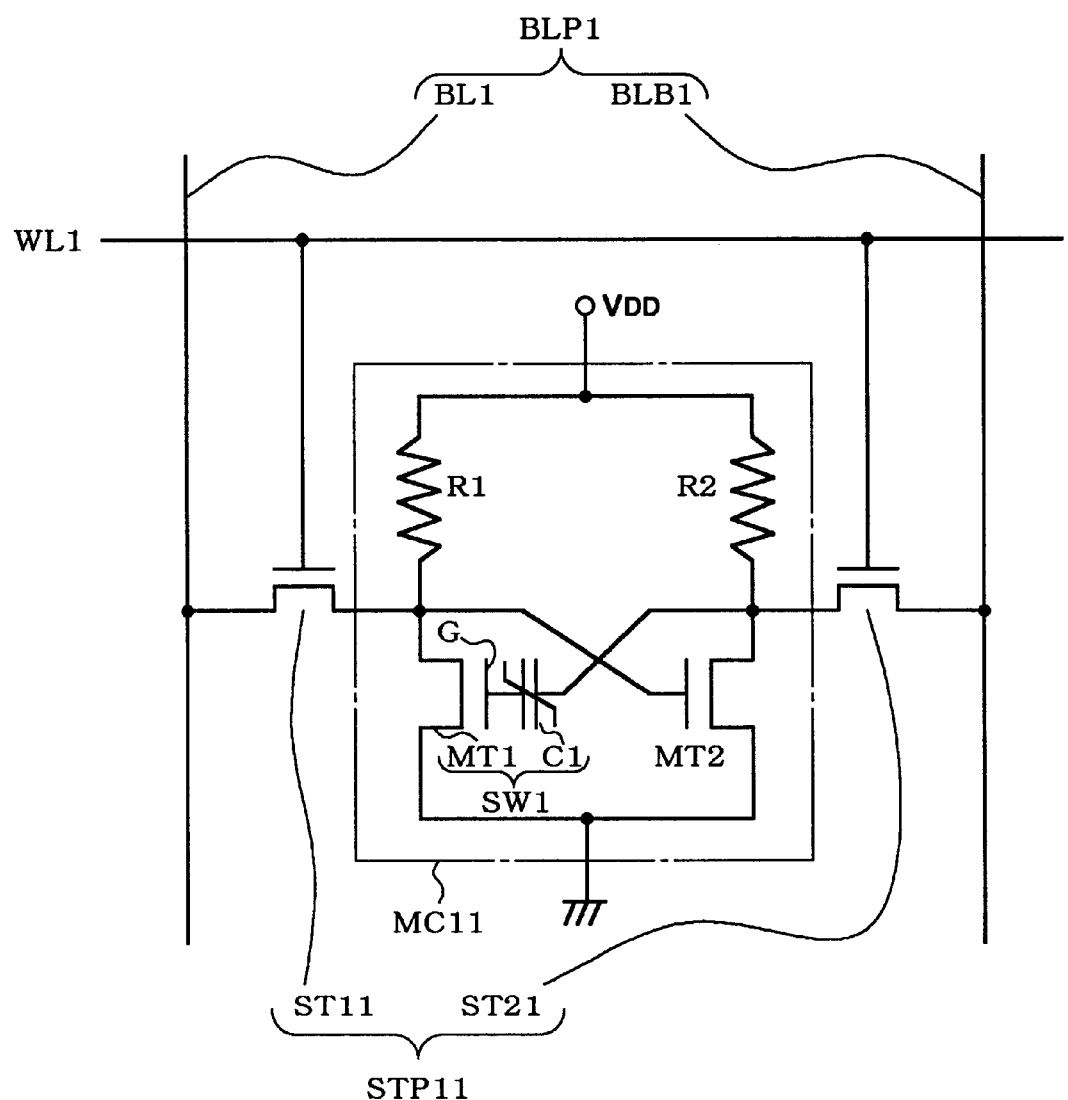
FIG. 13 is far another circuit diagram of the memory cell MC11 in practical use in still another embodiment according to the present invention.

Further, a switch SW1 shown in FIG. 13 may be used as the switch including a ferroelectric part. The switch shown in FIG. 13 includes an ordinary MOSFET forming the memory transistor MT1 and a ferroelectric capacitor C1. The ferroelectric capacitor C1 is connected between a gate electrode G of the memory transistor MT1 and a resistor R2 in series.

By constructing the memory cell MC11 as shown in FIG. 13, a nonvolatile memory device can easily be fabricated by just adding a ferroelectric capacitor to the transistor used in the prior art SRAM or other prior art data storing device without any modifications.

Although, all the memory cells MC00, MC01, . . . composing the memory device 10 shown in FIG. 1 include the ferroelectric parts in the embodiments described above, the present invention is not limited to the structure. The memory cells of the present invention may be constructed in a structure that only a part of the memory cells MC00, MC01, . . . have the ferroelectric parts and no ferroelectric parts are provided to the remaining memory cells. By constructing the data storing device as described above, only a part of the memory cells used for the prior art SRAM can be replaced with nonvolatile memory elements. In this way, a data storing device arranging both volatile memory elements and nonvolatile memory elements in a predetermined percentage can be realized easily.

Figure 2:
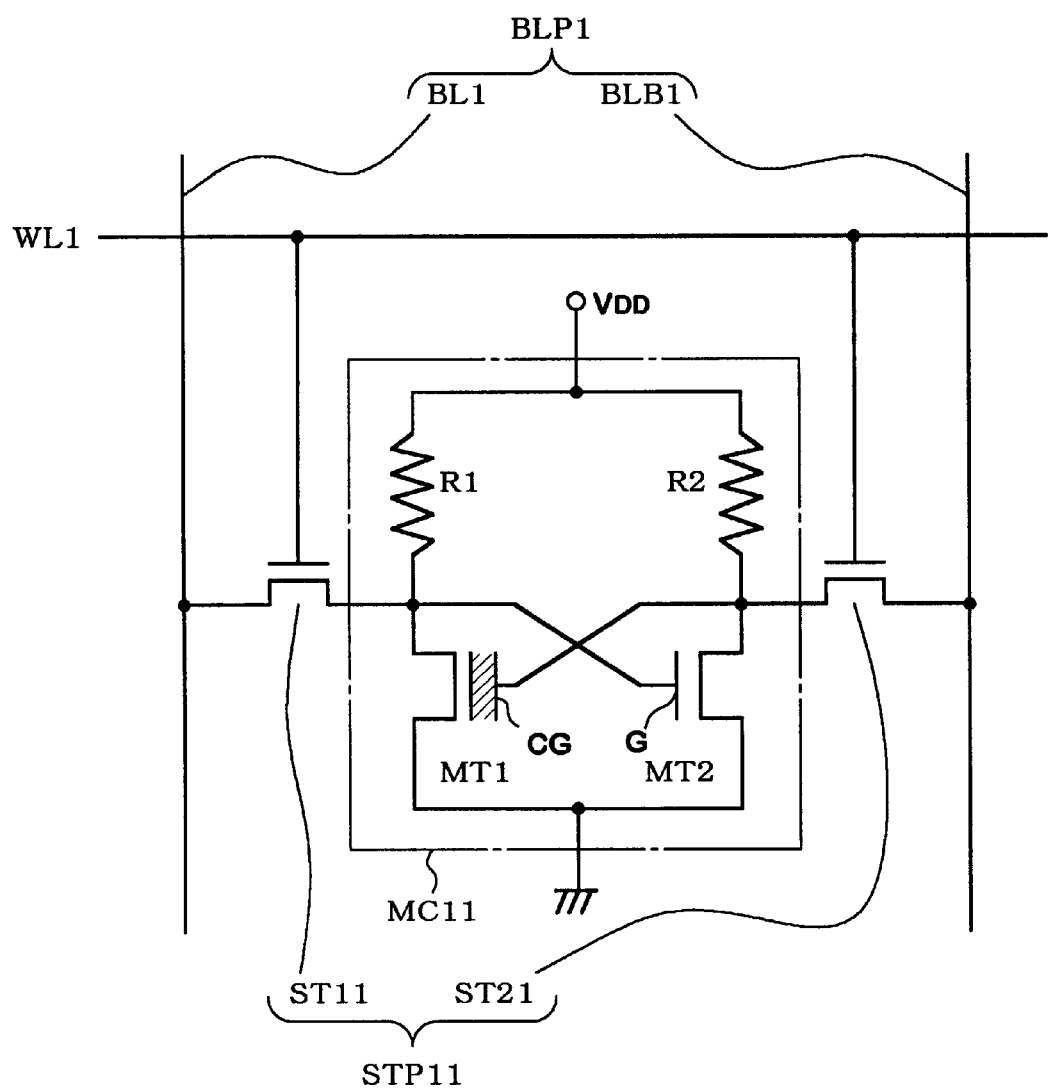
FIG. 2 is a circuit diagram of a memory cell MC11 shown in FIG. 1 in practical use.

Although, the memory cell including a pair of the memory transistors MT1, MT2 as well as pair of the resistors R1, R2 shown in FIG. 2 is described in the above embodiments as one of the memory cells, other types of memory cells can be used instead of the memory cell described above. For example, the present invention is applicable to a memory cell including a pair of memory transistors with a pair of diodes, or other memory cell including a pair of memory transistors with other type(s) of transistor.

In the case of applying the present invention to a memory cell using a pair of memory transistors with a pair of other type of transistors (CMOS cell or the like), ferroelectric part(s) can be provided to any of the transistors composing the memory cell. It is therefore, the ferroelectric parts can be provided to all the transistors within the two pairs.

Although, the memory transistor is a MOSFET type transistor with n-channel in the embodiments described above, the present invention is applicable even when the memory transistor is formed by a MOSFET with p-channel.

Further, the first switch and the second switch described in the above embodiments are not limited to switches including transistors having a MOSFET structure. For example, switching elements including transistors other than the transistors having the MOSFET structure and/or switching elements not using transistors can be used.

The present invention is characterized in that, a ferroelectric part is provided to at least one of the first switch and the second switch, and wherein the ferroelectric part stores a polarization state in response to the switching state of the switch.

Therefore, the ferroelectric part keep storing the polarization state in response to the switching state of the switch even when a power supply of the device is turned off. Further, the switch recovers its switching state in response to the polarization state stored in the ferroelectric part. In this way, a power supply just for maintaining the data is not required.

Further, a time period needed for the ferroelectric part to reach the polarization state in response to the switching state of the switch may be a short period because a polarization reversal performed in a ferroelectric material requires a short period of time. Therefore, data can be stored in a short period unlike to that of the EEPROM, so that a high-speed response can be carried out.

Still further, lower voltages can be used for storing and erasing the data unlike to that of the EEPROM. It is therefore not necessary to provide either of a step-up transformer on the chip or an additional power supply to supply high voltages, so that the chip having compactness as well as lower manufacturing cost can be achieved.

The present invention is characterized in that, the ferroelectric parts which store the polarization states in response to the switching states of the switches are provided to both the first switch and the second switch.

Therefore, the data storing device according to the present invention can be realized by utilizing almost the same circuit arrangement to the data storing device having a pair of memory transistors used conventionally such as an SRAM. In this way, the cost and the time spent to design the circuit can be reduced remarkably.

Further, the cost and the time spent to design the manufacturing processes can also be reduced noticeably because the manufacturing process of the device according to the present invention is similar to that of the conventional device. Also, slight modifications of the manufacturing facilities are necessary to manufacture the device. That is, masks or other facilities used for manufacturing the conventional device can be used in the manufacturing process of the device according to the present invention. In this way, only a few additional equipments are required.

In other words, a data storing device capable of responding in a high speed without providing a power supply just for maintaining the stored data can be manufactured in a short delivery term under a low manufacturing cost.

The present invention is characterized in that, the transistor for storing data which composes the switch including the ferroelectric part further comprises a ferroelectric layer formed on the first conductive layer, and a second conductive layer formed on the ferroelectric layer.

Therefore, transistors having the "MFMIS structure" (in which layers composed of a metal layer, a ferroelectric layer, another metal layer, an insulation layer and a silicon layer are formed sequentially in that order from the top) can be used as the memory transistors. In this way, the device according to the present invention can be manufactured by just adding process for forming both the ferroelectric layer and the second conductive layer to the manufacturing process of the conventional SRAM or similar products.

The present invention is characterized in that, the insulation layer of the transistor for storing data which composes the switch including the ferroelectric part is made of a ferroelectric material. Therefore, the device according to the present invention can be manufactured by just changing the material of the insulation layer of the memory transistors used in the SRAM and the like from a silicon oxidation material to a ferroelectric material.

The present invention is characterized in that, a ferroelectric capacitor is connected in serial to the first conductive layer of the transistor for storing data which composes the switch including the ferroelectric part.

In this way, the device according to the present invention can be manufactured by just adding the ferroelectric capacitor while using the memory transistors used in the SRAM and the like.

The present invention is characterized in that, the ferroelectric parts which store the polarization states in response to the switching states of the switches are provided to both the first switch and the second switch.

Therefore, a stable data storing is ensured in comparison with the first switch and the second switch either one of which has the ferroelectric part even when the power supply of the device is turned off. In this way, reliability of the device as a ferroelectric data storing device can be improved further.

The present invention is characterized in that, the data storing device further includes memory elements having the first switch and the second switch both including no ferroelectric part.

In this way, a data storing device arranging both volatile memory elements and nonvolatile memory elements in a predetermined percentage can be realized easily by replacing only a part of the memory cells used for the prior art SRAM with nonvolatile memory elements.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A data storing device including a memory element having a first switch and a second switch each composed so as to show different switching states, either of a first storing state or a second storing state being stored in the memory element in response to data to be stored therein, the first state being defined as the first switch being ON state when the second switch being OFF state, and the second storing state being defined as the first switch being OFF state when the second switch being ON state, wherein a ferroelectric part is provided alone to one of the first switch and the second switch, and wherein the ferroelectric part stores a polarization state in response to the switching state of the switch.

2. The data storing device in accordance with claim 1, wherein the data storing device further includes a memory element having a third switch and a fourth switch both including no ferroelectric part.

3. The data storing device in accordance with claim 1, wherein both the first switch and the second switch in the memory cell include a transistor for storing data comprising;

A) a first conductive type source region and a first conductive type drain region both formed in a semiconductor substrate, B) a second conductive type channel region disposed between the source region and the drain region, C) an insulation layer disposed on the channel region, and D) a first conductive layer disposed on the insulation layer.

4. The data storing device in accordance with claim 3, wherein the data storing device further includes a memory element having a third switch and a fourth switch both including no ferroelectric part.

5. The data storing device in accordance with claim 3, wherein the transistor for storing data which composes the switch including the ferroelectric part further comprises;

E) a ferroelectric layer formed on the first conductive layer, and

F) a second conductive layer formed on the ferroelectric layer.

6. The data storing device in accordance with claim 5, wherein the data storing device further includes a memory element having a third switch and a fourth switch both including no ferroelectric part.

7. The data storing device in accordance with claim 3, wherein the insulation layer of the transistor for storing data which composes the switch including the ferroelectric part is made of a ferroelectric material.

8. The data storing device in accordance with claim 7, wherein the data storing device further includes a memory element having a third switch and a fourth switch both including no ferroelectric part.

9. The data storing device in accordance with claim 3, wherein a ferroelectric capacitor is connected in serial to the first conductive layer of the transistor for storing data which composes the switch including the ferroelectric part.

10. The data storing device in accordance with claim 9, wherein the data storing device further includes a memory element having a third switch and a fourth switch both including no ferroelectric part.

11. The data storing device in accordance with claim 5, wherein an uppermost conductive layer of the transistor for storing data which composes the first switch, and one region out of the source region and the drain region of the transistor for storing data which composes the second switch are connected each other, and wherein an uppermost conductive layer of the transistor for storing data which composes the second switch, and one region out of the source region and the drain region of the transistor for storing data which composes the first switch are connected each other, and wherein the other regions out of the source regions and the drain regions of pair of the transistors for storing data both compose the first switch and the second switch are connected each other.

12. The data storing device in accordance with claim 11, wherein the one region of the transistor for storing data which composes the first switch is connected to one voltage out of a power supply voltage and a ground voltage through a first resistor, and wherein the one region of the transistor for storing data which composes the second switch is connected to the one voltage through a second resistor, and wherein the other regions of pair of the transistors for storing data both compose the first switch and the second switch are connected to the other voltage out of the power supply voltage and a ground voltage.

13. The data storing device in accordance with claim 12, wherein data is stored by applying voltages having different values respectively to a first interconnection formed between the transistor for storing data which composes the first switch and the first resistor and a second interconnection formed between the transistor for storing data which composes the second switch and the second resistor, and wherein the data thus stored is read out in accordance with a potential difference arising between the first interconnection and the second interconnection.

14. The data storing device in accordance with claim 7, wherein an uppermost conductive layer of the transistor for storing data which composes the first switch, and one region out of the source region and the drain region of the transistor for storing data which composes the second switch are connected each other, and wherein an uppermost conductive layer of the transistor for storing data which composes the second switch, and one region out of the source region and the drain region of the transistor for storing data which composes the first switch are connected each other, and wherein the other regions out of the source regions and the drain regions of pair of the transistors for storing data both compose the first switch and the second switch are connected each other.

15. The data storing device in accordance with claim 14, wherein the one region of the transistor for storing data which composes the first switch is connected to one voltage out of a power supply voltage and a ground voltage through a first resistor, and wherein the one region of the transistor for storing data which composes the second switch is connected to the one voltage through a second resistor, and wherein the other regions of pair of the transistors for storing data both compose the first switch and the second switch are connected to the other voltage out of the power supply voltage and a ground voltage.

* * * * *